(12) United States Patent
Sheng et al.

(10) Patent No.: US 12,148,723 B2
(45) Date of Patent: Nov. 19, 2024

(54) STRUCTURE OF SEMICONDUCTOR DEVICE

(71) Applicant: United Microelectronics Corp., Hsinchu (TW)

(72) Inventors: Zhirui Sheng, Singapore (SG); Hui-Ling Chen, Kaohsiung (TW); Chung-Hsing Kuo, Taipei (TW); Chun-Ting Yeh, Taipei (TW); Ming-Tse Lin, Hsinchu (TW); Chien En Hsu, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 61 days.

(21) Appl. No.: 18/077,191

(22) Filed: Dec. 7, 2022

(65) Prior Publication Data

US 2023/0101900 A1 Mar. 30, 2023

Related U.S. Application Data

(62) Division of application No. 16/984,601, filed on Aug. 4, 2020, now Pat. No. 11,557,558.

(30) Foreign Application Priority Data

Jul. 3, 2020 (CN) .......................... 202010637115.7

(51) Int. Cl.
*H01L 21/66* (2006.01)
*H01L 23/00* (2006.01)
*H01L 25/00* (2006.01)
*H01L 25/065* (2023.01)

(52) U.S. Cl.
CPC .............. *H01L 24/06* (2013.01); *H01L 22/32* (2013.01); *H01L 24/80* (2013.01); *H01L 25/0657* (2013.01); *H01L 25/50* (2013.01); *H01L 2224/0605* (2013.01); *H01L 2224/0612* (2013.01); *H01L 2224/0651* (2013.01); *H01L 2224/8034* (2013.01)

(58) Field of Classification Search
CPC ........... H01L 2224/08145; H01L 22/32; H01L 22/34; H01L 22/30
See application file for complete search history.

(56) References Cited

U.S. PATENT DOCUMENTS

| 7,382,038 | B2 | 6/2008 | Wu |
| 9,633,955 | B1 | 4/2017 | Huang et al. |
| 9,728,521 | B2 | 8/2017 | Tsai et al. |
| 10,340,230 | B1 | 7/2019 | Shen et al. |
| 10,790,248 | B2 | 9/2020 | Chen et al. |
| 10,978,391 | B2 | 4/2021 | Weng et al. |

(Continued)

*Primary Examiner* — Kretelia Graham
*Assistant Examiner* — David J Goodwin
(74) *Attorney, Agent, or Firm* — JCIPRNET

(57) ABSTRACT

A structure of semiconductor device is provided, including a first circuit structure, formed on a first substrate. A first test pad is disposed on the first substrate. A second circuit structure is formed on a second substrate. A second test pad is disposed on the second substrate. A first bonding pad of the first circuit structure is bonded to a second bonding pad of the second circuit structure. One of the first test pad and the second test pad is an inner pad while another one of the first test pad and the second test pad is an outer pad, wherein the outer pad surrounds the inner pad.

7 Claims, 6 Drawing Sheets

(56) References Cited

U.S. PATENT DOCUMENTS

| | | |
|---|---|---|
| 11,450,633 B2 | 9/2022 | Lin et al. |
| 11,621,247 B2 * | 4/2023 | Park .................... H01L 25/0657 257/777 |
| 11,901,338 B2 * | 2/2024 | Kim ........................ H01L 24/08 |
| 2012/0156740 A1 * | 6/2012 | Pharkya ............... C12N 15/815 435/254.2 |
| 2012/0187530 A1 | 7/2012 | Zhang et al. |
| 2015/0115986 A1 | 4/2015 | Wang et al. |
| 2015/0233698 A1 * | 8/2015 | Huang .................. H01L 21/768 324/691 |
| 2016/0178344 A1 | 6/2016 | Farooq et al. |
| 2018/0269161 A1 | 9/2018 | Wu et al. |
| 2019/0131277 A1 | 5/2019 | Yang et al. |
| 2019/0355696 A1 | 11/2019 | Liu et al. |
| 2019/0363079 A1 | 11/2019 | Thei et al. |
| 2020/0091063 A1 | 3/2020 | Chen et al. |
| 2020/0159133 A1 | 5/2020 | Yan et al. |
| 2021/0082896 A1 | 3/2021 | Harashima et al. |
| 2021/0320038 A1 * | 10/2021 | Hsu ........................ H01L 24/06 |

* cited by examiner

STRUCTURE OF SEMICONDUCTOR DEVICE

CROSS-REFERENCE TO RELATED APPLICATION

This application is a divisional application of and claims the priority benefit of a prior application Ser. No. 16/984,601, filed on Aug. 4, 2020, which claims the priority benefit of Chinese patent application serial no. 202010637115.7, filed on Jul. 3, 2020. The entirety of each of the above-mentioned patent applications is hereby incorporated by reference herein and made a part of this specification.

BACKGROUND OF THE INVENTION

Field of the Invention

The invention relates to a semiconductor fabrication technology, in particular, to a structure of semiconductor device and method for bonding two substrates.

Description of Related Art

In development for the semiconductor fabrication technology, the fabrication may be divided into two parts, in which the corresponding circuits are respectively fabricated on two substrates. To the individual substrate, after accomplishing the fabrication of the circuit, the surface of the substrate, which is to be bonding to the circuit of another substrate, would be formed with a plurality of bonding pads at the corresponding locations. Then, the two substrates are bonded according to the packaging technology. At the ideal condition, the bonding pads of the two substrates would be precisely bonded together, to form the whole integrated circuit.

In bonding process for the two substrates, the two substrates need to be aligned therebetween, before performing the bonding the substrates. The alignment process involves fabricating the alignment marks respectively on the substrates. However, the alignment marks as used to align one substrate to another substrate, the size of the alignment masks is rather large in relative to the size of the bonding pads for the device structure on the substrate, and then the alignment precision is relatively loose. As a result, even if the alignments marks on the substrate may be quite precisely aligned, a shift between the bonding pads of the fine devices may still occur, causing improper electric connection or even causing a connection failure.

Thus, if the miss alignment occurs between the substrate and the substrate, as foreseen, the bonding pads on the wafers may not be well bonded, and even the boding failure would occur. In addition, it is hard to effectively detect for each one of the individual circuits, so to assure the bonding condition for the circuits and then the circuit with poor bonding condition may be detected out and excluded.

SUMMARY OF THE INVENTION

The invention provides a structure of semiconductor device and method for bonding two substrates, at least being capable of effectively detecting the bonding condition of the bonding pads between the two partial circuits after the two substrates are has been bonded. Thus, the circuit with poor bonding condition may be detected out.

In an embodiment, the invention provides a structure of semiconductor device. The structure of semiconductor device includes a first circuit structure, formed on a first substrate. A first test pad is disposed on the first substrate. A second circuit structure is formed on a second substrate. A second test pad is disposed on the second substrate. A first bonding pad of the first circuit structure is bonded to a second bonding pad of the second circuit structure. One of the first test pad and the second test pad is an inner pad while another one of the first test pad and the second test pad is an outer pad, wherein the outer pad surrounds the inner pad.

In an embodiment, as to the structure of semiconductor device, it further includes a first leading circuit disposed on the first substrate to connect to the first test pad and a second leading circuit disposed on the second substrate to connect to the second test pad.

In an embodiment, as to the structure of semiconductor device, the first leading circuit and the second leading circuit respectively provide test terminals in use for test.

In an embodiment, as to the structure of semiconductor device, the inner pad includes at least one pad and the outer pad includes a ring pad.

In an embodiment, as to the structure of semiconductor device, the at least one pad includes a round pad, a rectangle pad, a triangle pad, a square pad, or a geometrical pad, wherein the ring pad includes a round ring pad, a rectangle ring pad, a triangle ring pad, a square ring pad, or a geometrical ring pad.

In an embodiment, as to the structure of semiconductor device, the at least one pad is a single pad being round shape, rectangle shape, triangle shape, square shape, or a geometrical shape, wherein the ring pad has a ring shape evenly surrounding the single pad.

In an embodiment, as to the structure of semiconductor device, the inner pad includes at least one first pad and the outer pad includes a plurality of second pads formed as a distribution surrounding the inner pad.

In an embodiment, as to the structure of semiconductor device, the at least one first pad includes a round pad, a rectangle pad, a triangle pad, a square pad, or geometrical pad.

In an embodiment, as to the structure of semiconductor device, the at least one first pad is a single pad being round shape, rectangle shape, triangle shape, square shape, or geometrical shape, wherein the second pads form as a distribution surrounding the inner pad.

In an embodiment, as to the structure of semiconductor device, the inner pad is a single round pad, a single rectangle pad, a single triangle pad, a single square pad, or a single geometrical pad, wherein the outer pad corresponding to the inner pad is a round ring, a rectangle ring, a triangle ring, a square ring, or a geometrical ring.

In an embodiment, the invention also provides a method for bonding two substrates. The method includes providing a first substrate, wherein the first substrate has a first circuit structure and a first test pad and providing a second substrate, wherein the second substrate has a second circuit structure and a second test pad. The first bonding pad of the first circuit structure is bonded to the second bonding pad of the second circuit structure. One of the first test pad and the second test pad is an inner pad while another one of the first test pad and the second test pad is an outer pad. The outer pad surrounds the inner pad after bonding the first circuit structure to the second circuit structure.

In an embodiment, as to the method for bonding two substrates, the first substrate as provided further includes a first leading circuit in connection to the first test pad, wherein the second substrate as provided further includes a second leading circuit in connection to the second test pad.

In an embodiment, as to the method for bonding two substrates, the first leading circuit and the second leading circuit as provided respectively provide test terminals in use for test.

In an embodiment, as to the method for bonding two substrates, the inner pad as provided includes at least one pads and the outer pad as provided includes a ring pad.

In an embodiment, as to the method for bonding two substrates, the at least one pad as provided includes a round pad, a rectangular pad, a triangular pad, a square pad, or a geometric pad, wherein the ring pad includes a round ring pad, a rectangular ring pad, a triangular ring pad, a square ring pad, or a geometric ring pad.

In an embodiment, as to the method for bonding two substrates, the at least one pad is a single pad with a round shape, a rectangular shape, a triangular shape, a square shape, or a geometric shape, wherein the ring pad is a ring shape uniformly surrounds the single pad.

In an embodiment, as to the method for bonding two substrates, the inner pad as provided includes at least one first pad and the outer pad as provided includes a plurality of second pads in a distribution surrounding the inner pad.

In an embodiment, as to the method for bonding two substrates, the at least one first pad includes a round pad, a rectangular pad, a square pad, or a geometric pad.

In an embodiment, as to the method for bonding two substrates, the at least one pad is a single pad with a round shape, a rectangular shape, a triangular shape, a square shape, or a geometric shape, wherein the second pads uniformly surround the single pad.

In an embodiment, as to the method for bonding two substrates, the inner pad as provided is a single round pad, a single rectangular pad, a single triangular pad, a single square pad, or a single geometrical pad, wherein the outer ring pad as provided corresponding to the inner pad is a round ring, a rectangular ring, a triangular ring, a square ring, or a geometrical ring.

BRIEF DESCRIPTION OF THE DRAWINGS

In order to make the aforementioned and other objectives and advantages of the present invention comprehensible, embodiments accompanied with figures are described in detail below.

DESCRIPTION OF THE EMBODIMENTS

The invention proposes a test pad used in bonding a substrate to another substrate. After the substrate is bonded to another substrate, the bonding status of the bonding pads between the two partial circuits respectively disposed on the two substrates may be effectively detected out. Thus, the circuit with improper connection may be simply and effectively detected out.

Multiple embodiments are provided for describing the invention but the invention is not just limited to the embodiments as provided. In addition, the combination between the embodiments as provided may also be properly taken.

Figure 1:
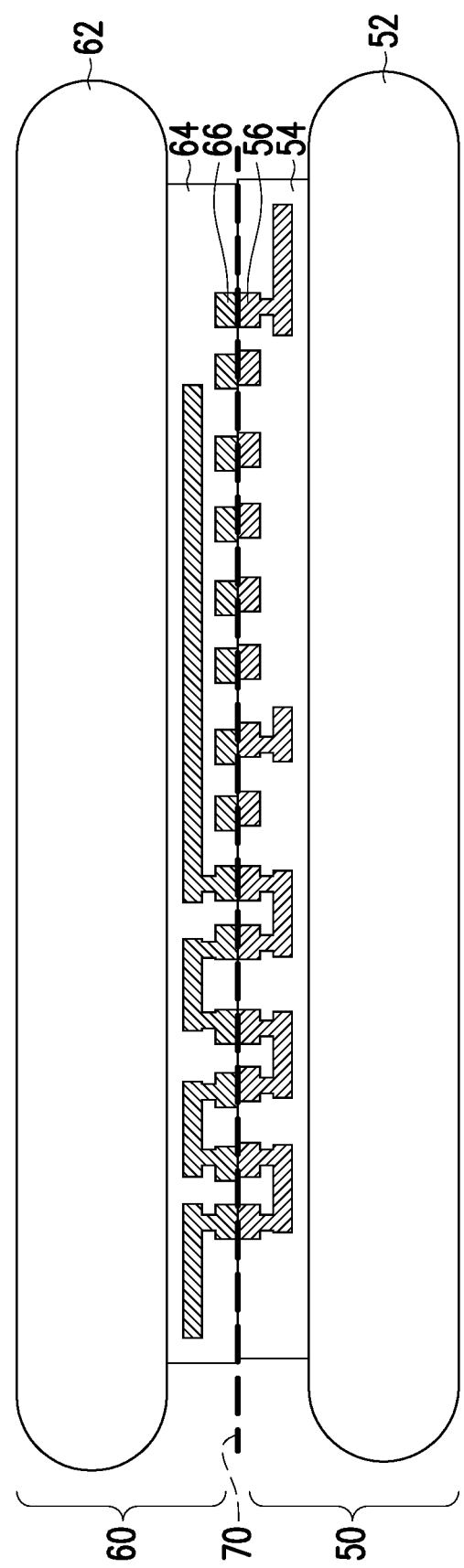
FIG. 1 is a drawing, schematically illustrating a cross-section structure for bonding a substrate to another substrate, according to an embodiment of the invention.

FIG. 1 is a drawing, schematically illustrating a cross-section structure for bonding a substrate to another substrate, according to an embodiment of the invention. Referring to FIG. 1, in a substrate 50, taking a working substrate 52 as a base for an example, a partial circuit of the whole integrated circuit may be completely fabricated. Based on the semiconductor fabrication technology, multiple dielectric layers are formed to support the structures according to the actual need, so to form the circuit as designed. These dielectric layers are generally referred to the inter-layer dielectric (ILD) layer 54. The partial circuit on the working substrate 52 is enclosed and supported by the ILD layer 54. The partial circuit has the bonding pad 56 as exposed at the surface of the substrate 50. The bonding pad 56 are used in the boding process for substrate-to-substrate and then is electrically connected to the bonding pads 66 of another substrate 60. The substrate 60 is also fabricated based on the semiconductor fabrication technology, respectively taking the working substrate 62 as a base, to accomplish the fabrication of another partial circuit of the whole integrated circuit. It includes the bonding pad 66 at the top layer. This partial circuit is also enclosed and supported by another ILD layer 64. After accomplishing the fabrication of the substrate 60 and the substrate 50, respectively, they are bonded at the bonding surface 70 according to the bonding process, so that the bonding pad 66 is electrically connected to the bonding pad 56.

To have connection between the bonding pad 66 and the bonding pad 56, the substrate 50 and the substrate 60 need to be well aligned. A peripheral region in the substrate 50 and the substrate 60 not for fabricating the circuit is additionally formed with the alignment marks. In an example, the alignment marks may include multiple units, extending along two directions, which are perpendicular to each other. Thus, the alignment marks respectively formed on the substrate 50 and the substrate 60 may be used to perform alignment in two dimensions. At the ideal situation for the substrate 50 and the substrate 60, the bonding pad 66 and the bonding pad 56 thereof may be bonded with precise alignment.

However, the size of alignment mark is relatively much large to the size of the semiconductor device as to be fabricated. The alignment marks on the substrate 50 and the substrate 60 may be aligned, according to the alignment precision as expected in the alignment process but a shift or even without connection between the bonding pad 56 and the bonding pad 66 of some semiconductor device may still occur. In general as an example, the circuit located at the peripheral region of the substrate has more possibility at the situation with bonding shift.

Figure 2:
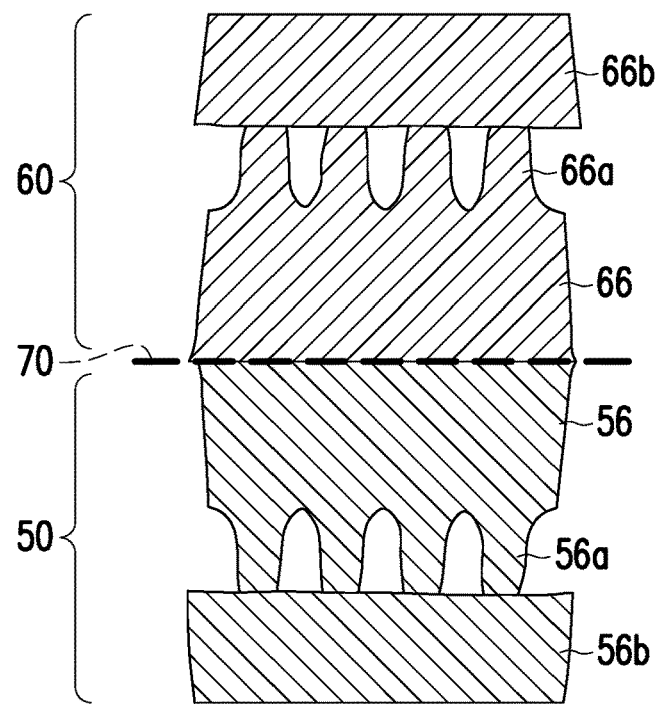
FIG. 2 is a drawing, schematically illustrating a cross-section structure for bonding a substrate to another substrate with precise alignment, according to an embodiment of the invention.

FIG. 2 is a drawing, schematically illustrating a cross-section structure for bonding a substrate to another substrate with precise alignment, according to an embodiment of the invention. Referring to FIG. 2, as to the pair of bonding pads 56, 66 to be connected, the connection may have a large contact area under the status of precise alignment. In an example, the whole area may have contact in connection. For the actual circuit structure in an example, the bonding pads 56, 66 may be connected to the circuit 56b, 66b through the plug structures 56a, 66a, so as to form the circuit structures on the substrates 50 and the substrate 60. Since the bonding pads 56, 66 have large area in contact, they have well status in electric connection and have the connection status as expected.

Figure 3:
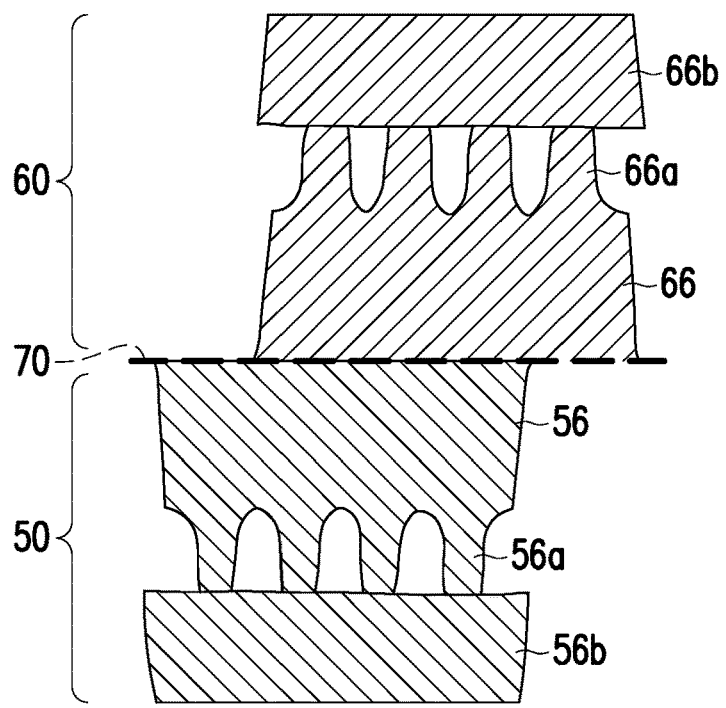
FIG. 3 is a drawing, schematically illustrating a cross-section structure for bonding a substrate to another substrate with poor alignment, according to an embodiment of the invention.

FIG. 3 is a drawing, schematically illustrating a cross-section structure for bonding a substrate to another substrate with poor alignment, according to an embodiment of the invention. Referring to FIG. 3, the size of the bonding pads 56, 66 and the distance between device structures are relatively much smaller than the size of alignment mark for several times. Further, the individual circuit has different fabrication error in accordance with the location on the substrate. In this situation, a shift between some of the bonding pads 66 and the bonding pads 56 may possibly occur, that is, a status of miss alignment occurs.

If the contact area between the bonding pad 56 and the bonding pad 66 is insufficient, it may cause insufficient for electric conduction and then affect the performance of the circuit. Even further, if the bonding pad 56 and the bonding pad 66 are substantially dislocated, the electric connection would get failure. The integrated circuit is failure in fabrication and needs to be excluded.

The invention takes at least the considerations that the alignment may be done with better precision during the bonding stage and the circuit potentially with defect connection may be easily detected out. A test structure with the size corresponding to the size of the device structure is proposed to be also formed with the corresponding circuit. The test structure provides the auxiliary function during the bonding stage for bonding the substrate to the substrate to effectively detect out the status of bonding connection for each individual circuit.

Figure 4:
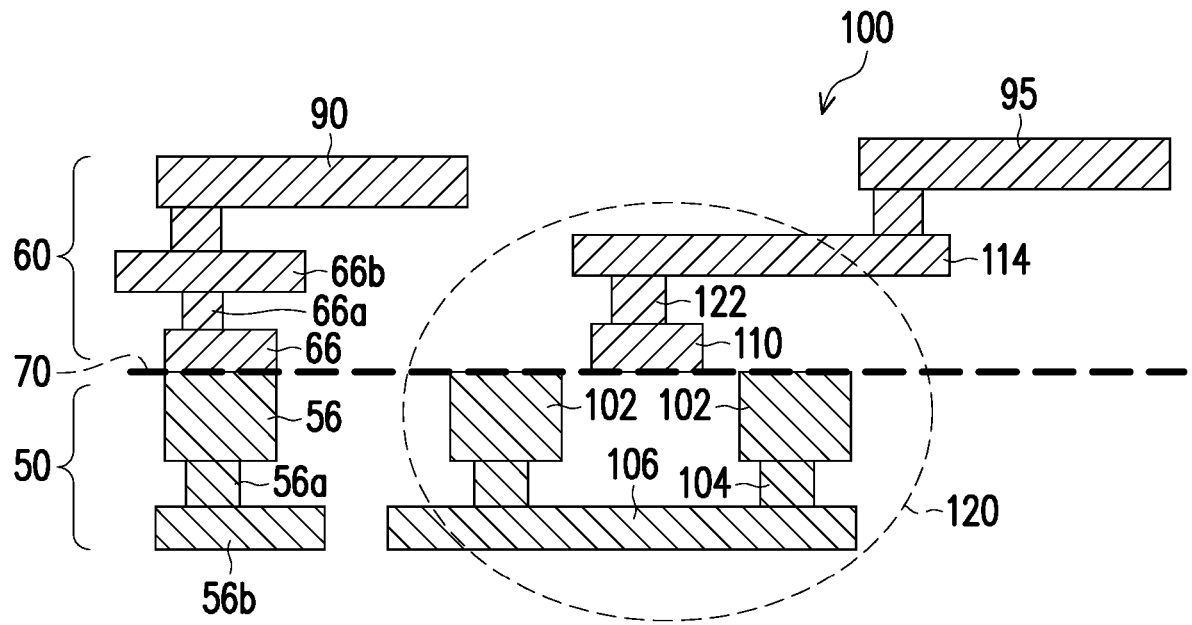
FIG. 4 is a drawing, schematically illustrating a structure of semiconductor device implemented with a test pad in a cross-section view of the bonding structure for substrate bonding to substrate, according to an embodiment of the invention.

FIG. 4 is a drawing, schematically illustrating a structure of semiconductor device implemented with a test pad in a cross-section view of the bonding structure for substrate bonding to substrate, according to an embodiment of the invention. Referring to FIG. 4, the structure of semiconductor device includes a substrate 50 and a substrate 60. The circuit structure on the substrate 50 in an example includes a circuit 56b, a plug structure 56a and a bonding pad 56. The bonding pad 56 is further connected to the circuit 66b, which is another partial circuit of whole, through the plug structure 66a to form the complete integrated circuit.

The invention proposes test structures 100, of which the test pads 102, 110 respectively on the substrate 50 and the substrate 60, in which the size range in fabrication for the test structures 102, 110 is equivalent to the size of the bonding pads 56, 66. Test pads 102, 110 of the test structure 100 and the bonding pads 56, 66 are formed at the same time and also exposed at the bonding surface 70.

Figure 5A:
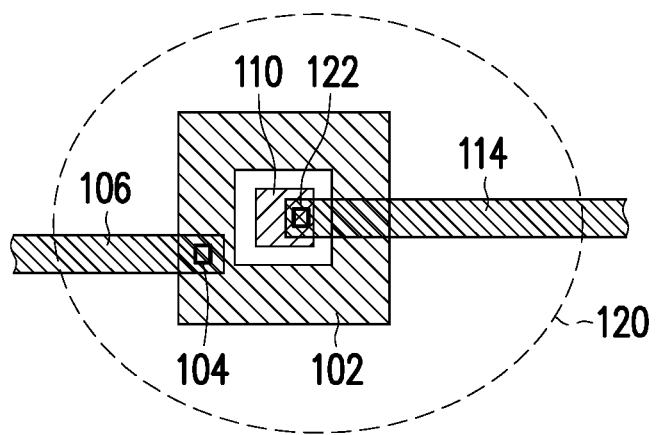
FIG. 5A is a drawing, schematically illustrating a top view of a test pad of a semiconductor device, according to an embodiment of the invention.

FIG. 5A is a drawing, schematically illustrating a top view of a test pad of a semiconductor device, according to an embodiment of the invention. The test structure 100 may be referred to FIG. 4 and FIG. 5A. In an embodiment, a top view of the local structure 120 of the test structure 100 is shown in FIG. 5A. The test pad 102 formed in the substrate 50 in an example is serving as an outer pad and the test pad 110 formed in the substrate 60 in an example is serving as an inner pad, but the test pad 102 and test pad 110 may be changed to form in the substrate 60 and the substrate 50.

In other words, one of the test pad 102 and the test pad 110 may serve as the inner pad and another one of the test pad 102 and the test pad 110 may serve as the outer pad. Outer pad of the test structure 100 is surrounding the inner pad. As the embodiment in FIG. 4, the test pad 102 is the outer pad and the test pad 110 is the inner pad.

The circuit 66b in an example further includes the interconnection structure 90 for further outward connection. Both the test pad 102 and the test pad 110 are connected to the leading circuit 114 and the leading circuit 106 through the plug structure 104, 122. The leading circuit 114 and the leading circuit 106 are then further connecting to the external test apparatus, which may detect the electric signals between the test pad 102 and the test pad 110 by the test probe, in an example. In an example, the leakage current may be measured. In addition, it may be further connected to the leading circuit 114 by implementing the interconnect structure 95 but the invention is not just limited to. In general, the test pad 102 and the test pad 110 in an example may provide the test terminals, respectively, in use for testing process.

The detecting mechanism is described as follows. If the bonding pad 56 and the bonding pad 66 are at the status being well aligned, the test pad 110 serving as the inner pad would be located at the central region of the test pad 102 serving as the outer pad. Thus, the isolation status between the test pad 102 and the test pad 110 is at the better condition, relatively, the leakage current is not induced or just at a relatively small level. As this detecting status, it would be judged that the connection between the bonding pad 56 and the bonding pad 66 are at well aligned.

Figure 5B:
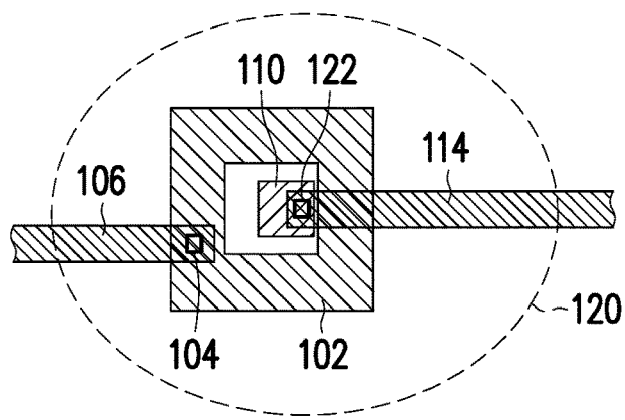
FIG. 5B is a top view of a test pad of a semiconductor device when miss alignment occurs, according to an embodiment of the invention.

FIG. 5B is a top view of a test pad of a semiconductor device when miss alignment occurs, according to an embodiment of the invention. Referring to FIG. 4 and FIG. 5B, when the connection between the bonding pad 56 and the bonding pad 66 is not at the well condition in alignment, the test pad 110 serving as the inner pad may shift away from the central region of the test pad 110 serving as the outer pad. In an embodiment, the test pad 110 has a region, which is more approaching to the teste pad 102. As this status, the isolation status between the test pad 110 and the test pad 102 may be relatively weak, and the relatively large leakage current would be induced. If the test pad 110 and the teste pad 102 are rather or fully dislocated, the test pad 110 and the test pad 102 may directly contact, causing a status of electric short.

Since the precision of the geometric locations for the test pad 110 and the test pad 102 is equivalent to that between the bonding pad 56 and the bonding pad 56. Then, the approaching status between the test pad 110 and the test pad 102 may be precisely detected, relatively, to indicate whether or not the bonding pad 56 and the bonding pad 66 are well connected in the bonding process.

Based on the implementation of the test pad 110 as the inner pad and the test pad 102 as the outer pad, the implementation is not just limited to the implementation manner in FIG. 5A. Under the detection mechanism in use of the inner pad and the outer pad, more implementation manners in modification are further described.

Figure 6:
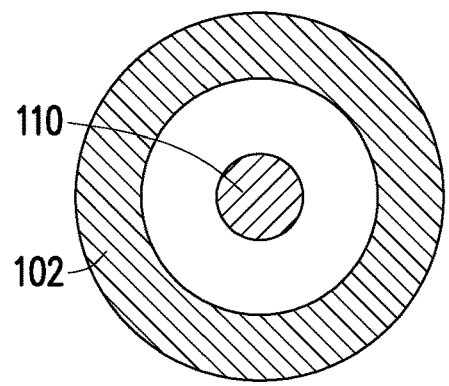
FIG. 6 to FIG. 11 are drawings, schematically illustrating various implementation for the test pad, according to embodiments of the invention.

FIG. 6 to FIG. 11 are drawings, schematically illustrating various implementation for the test pad, according to embodiments of the invention. Referring to FIG. 6, the geometric shape of the test pad 110 and the test pad 102 may be round shape as implemented. The test pad 102 remains to uniformly surround the test pad 110.

Figure 7:
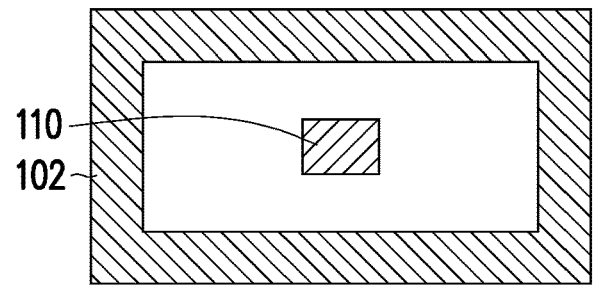
Figure 8:
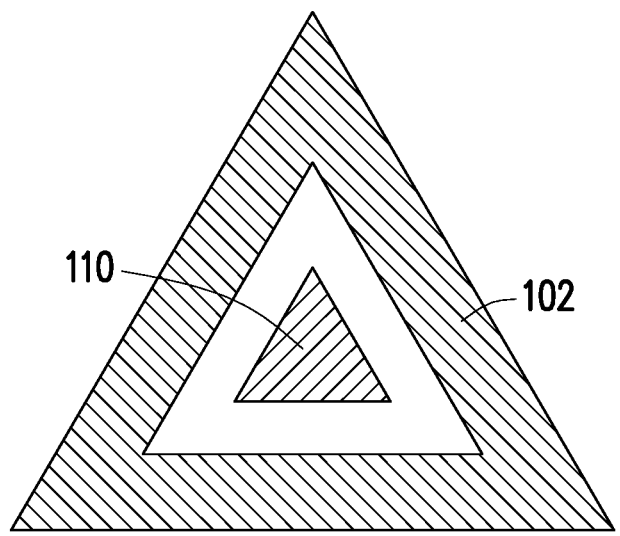
Figure 9:
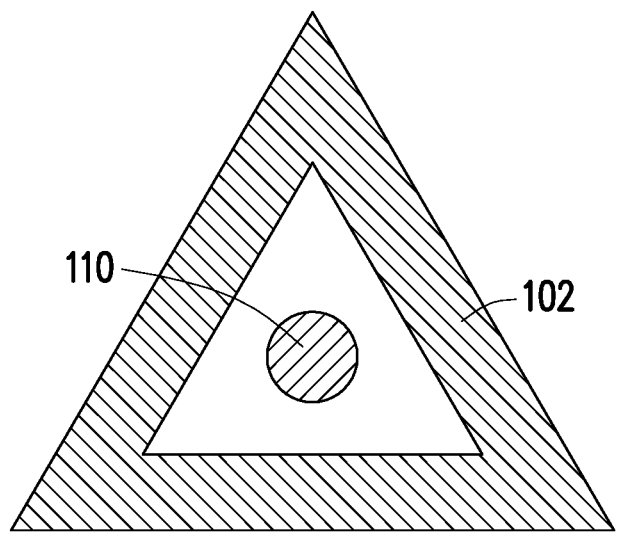

Referring to FIG. 7, the geometric shape of the test pad 110 and the test pad 102 may be rectangular shape as implemented. Referring to FIG. 8, the geometric shape of the test pad 110 and the test pad 102 may be the geometrical shape with implementation as intended, not limited to be round or square or rectangular. In an embodiment, the geometric shape of the test pad 110 and the test pad 102 may be triangular. Referring to FIG. 9, in an embodiment, the geometric shape of the test pad 110 and the test pad 102 may be not the same. As a modification from FIG. 8 as an example, the test pad is triangular shape and the test pad is a round shape.

Figure 10:
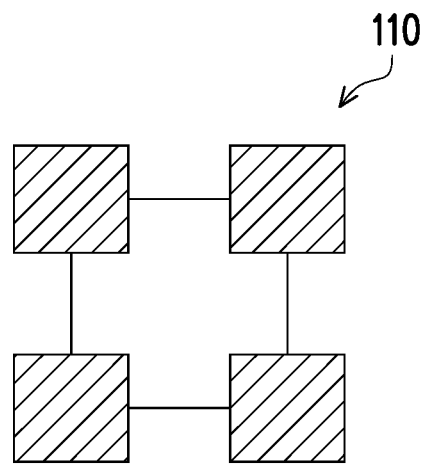

Referring to FIG. 10, further considering on the number of the test pad 110, it is not necessary to be single but may be multiple. As to the implementation with multiple test pads 110, the test pads 110 as the manner in FIG. 4 and FIG. 5A may be respectively connected to the leading circuit 114. In an embodiment, the electric connection between the multiple test pads 110 may be formed in an example. The number of these test pads 110 is not just limited to four and may be two or more.

Figure 11:
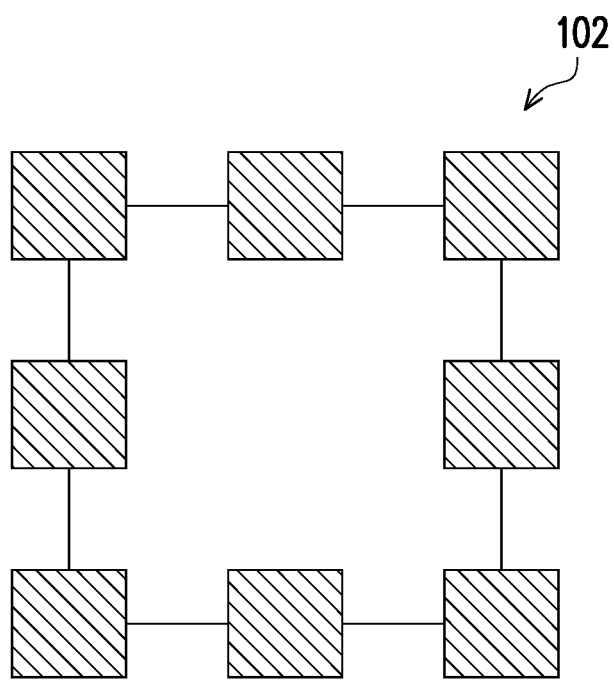

Referring to FIG. 11, the test pad serving as the outer pad may also be composed of multiple pads with the geometric shape, of which a distribution of the pads may surround the test pad 110. As to the implementation with multiple test pads 102, the test pads 102 as the manner in FIG. 4 and FIG. 5A may be respectively connected to the leading circuit 106. In an embodiment, the electric connection between the multiple test pads 102 may be formed in an example. The number of these test pads 102 is not just limited to the number as shown but may surround the test pad 110. It would be accepted for the implementation being capable of indicating the alignment status between the bonding pad 56 and the bonding pad 66.

As viewed from the mechanism for bonding two substrates, the invention may also provide a method for bonding two substrates. The method includes providing a first substrate 50, wherein the first substrate 50 has a first circuit structure and a first test pad 102. The first circuit structure in an example includes the bonding pad 56, the plug structure 56a, and the circuit 56b. In addition, a second substrate 60 is provided, wherein the second substrate has a second circuit structure and a second test pad 110. At the bonding surface 70, the bonding pad 56 of the first circuit structure is bonded to the bonding pad 66 of the second circuit structure. One of the first test pad 102 and the second test pad 110 is treated as an inner pad while another one of the first test pad and the second test pad is treated as an outer pad. The outer pad surrounds the inner pad after bonding the first circuit structure to the second circuit structure.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A structure of semiconductor device, comprising:
a first circuit structure, formed on a first substrate;
a first test pad, disposed on the first substrate;
a second circuit structure, formed on a second substrate; and
a second test pad, disposed on the second substrate,
wherein a first bonding pad of the first circuit structure is bonded to a second bonding pad of the second circuit structure, wherein one of the first test pad and the second test pad is an inner pad while another one of the first test pad and the second test pad is an outer pad, wherein the outer pad surrounds the inner pad,
wherein the inner pad includes at least one pad and the outer pad includes a closed ring pad.

2. The structure of semiconductor device as recited in claim 1, further comprising:
a first leading circuit, disposed on the first substrate to connect to the first test pad; and
a second leading circuit, disposed on the second substrate to connect to the second test pad.

3. The structure of semiconductor device as recited in claim 2, wherein the first leading circuit and the second leading circuit respectively provide test terminals in use for testing.

4. The structure of semiconductor device as recited in claim 1, wherein the at least one pad includes a round pad, a rectangle pad, a triangle pad, a square pad, or a geometrical pad, wherein the closed ring pad includes a round ring pad, a rectangle ring pad, a triangle ring pad, a square ring pad, or a geometrical ring pad.

5. The structure of semiconductor device as recited in claim 1, wherein the at least one pad is a single pad being round shape, rectangle shape, triangle shape, square shape, or a geometrical shape, wherein the closed ring pad has a ring shape evenly surrounding the single pad.

6. The structure of semiconductor device as recited in claim 1, wherein the at least one first pad includes a round pad, a rectangle pad, a triangle pad, a square pad, or geometrical pad.

7. The structure of semiconductor device as recited in claim 1, wherein the inner pad is a single round pad, a single rectangle pad, a single triangle pad, a single square pad, or a single geometrical pad, wherein the outer pad corresponding to the inner pad is a round ring, a rectangle ring, a triangle ring, a square ring, or a geometrical ring.

* * * * *